(12) United States Patent
Pouilly et al.

(10) Patent No.: US 12,342,512 B2
(45) Date of Patent: Jun. 24, 2025

(54) POWER ELECTRICAL APPARATUS COMPRISING TWO POWER ELECTRONIC MODULES AND AN INTEGRATED COOLING SYSTEM

(71) Applicant: VALEO EAUTOMOTIVE FRANCE SAS, Cergy (FR)

(72) Inventors: Aurelien Pouilly, Cergy (FR); Alexandre Legendre, Cergy (FR)

(73) Assignee: VALEO EAUTOMOTIVE FRANCE SAS, Cergy (FR)

( * ) Notice: Subject to any disclaimer, the term of this patent is extended or adjusted under 35 U.S.C. 154(b) by 215 days.

(21) Appl. No.: 18/041,350

(22) PCT Filed: Jul. 16, 2021

(86) PCT No.: PCT/EP2021/069935
§ 371 (c)(1),
(2) Date: Feb. 10, 2023

(87) PCT Pub. No.: WO2022/033803
PCT Pub. Date: Feb. 17, 2022

(65) Prior Publication Data
US 2023/0309274 A1    Sep. 28, 2023

(30) Foreign Application Priority Data
Aug. 13, 2020 (FR) .................................. 2008488

(51) Int. Cl.
*H05K 7/20* (2006.01)
*H01L 23/473* (2006.01)
*H02M 3/00* (2006.01)

(52) U.S. Cl.
CPC ....... *H05K 7/20927* (2013.01); *H01L 23/473* (2013.01); *H02M 3/003* (2021.05); *H05K 7/20254* (2013.01)

(58) Field of Classification Search
CPC ............ H05K 7/20254; H05K 7/20927; H01L 23/473; H02M 3/003
See application file for complete search history.

(56) References Cited

U.S. PATENT DOCUMENTS 8,059,404 B2 * 11/2011 Miller .................. H02M 7/003
                                                          174/547
10,707,771 B1    7/2020 Chen et al.
(Continued)

OTHER PUBLICATIONS

International Search Report Issued Oct. 14, 2021, in PCT/EP2021/069935, filed on Jul. 16, 2021, 3 pages.

*Primary Examiner* — Zachary Pape
(74) *Attorney, Agent, or Firm* — Oblon, McClelland, Maier & Neustadt, L.L.P.

(57) ABSTRACT

The invention relates to a power electrical apparatus comprising a first electrical module (21) forming a power electronic module, a second electrical module (22) forming a power electronic module, a third electrical module (4) forming a capacitive module which comprises a plurality of electrical components and a housing, a cooling system, configured to cool said second electrical module (22), a connecting portion of the cooling circuit connecting a first (31) and a second (32) cooling module, said connecting portion providing a fluidic connection between said first (31) and said second (32) cooling module, said first and second cooling modules (31-32) being positioned on either side of said third electrical module (4), said first and second cooling modules (31-32) each having a portion extending beyond one and the same lateral face of said third electrical module (4), vertically in line therewith, said portions facing one another.

15 Claims, 2 Drawing Sheets

(56) References Cited

U.S. PATENT DOCUMENTS

| | | | |
|---|---|---|---|
| 2008/0117602 A1* | 5/2008 | Korich | H01G 11/82 |
| | | | 361/715 |
| 2008/0198548 A1 | 8/2008 | Nakamura et al. | |
| 2011/0007480 A1* | 1/2011 | Souda | H01G 2/08 |
| | | | 361/728 |
| 2018/0145605 A1 | 5/2018 | Park et al. | |
| 2018/0286781 A1* | 10/2018 | Yoshihara | H01L 23/473 |
| 2019/0275895 A1 | 9/2019 | Jeong | |

* cited by examiner

POWER ELECTRICAL APPARATUS COMPRISING TWO POWER ELECTRONIC MODULES AND AN INTEGRATED COOLING SYSTEM

TECHNICAL FIELD

The present invention relates to the field of electrical devices, notably for vehicles, in particular for electric or hybrid vehicles. More specifically, the present invention targets a power electrical device, notably a DC/DC converter, an electrical charger or an inverter, comprising two power electronics modules and an integrated cooling system.

Generally, in electric motorization systems, it is necessary to provide cooling systems for certain electrical devices, in particular the motor, the DC/DC converter, the electrical charger and the inverter.

As is known, a power electrical device, in particular an inverter, comprises at least one power electronics module and one capacitor module. It is increasingly common for the inverter to comprise two power electronics modules in order to provide two distinct electrical conversion modes, these being from the battery to the electric motor, referred to as "generation", and from the electric motor to the battery, referred to as "regeneration".

To be specific, "power electronics module" is understood to mean an assembly comprising components through which energy powering the electric machine passes and which are notably intended to convert direct current to alternating current, or vice versa. These components can comprise electronic switches, such as for example semiconductor transistors, arranged in an electrical circuit so as to enable a controlled passage of electrical energy between the high-voltage power supply battery and the electric machine. In particular, the components are bare semiconductor chips which have a casing that forms a body encapsulating them. In other words, a power electronics module is an assembly comprising a plurality of semiconductor chips that form an electrical circuit and are encapsulated in one and the same casing.

Generally, according to the prior art, an inverter comprises a cooling system having a fluid cooling circuit configured to convey a cooling fluid, in particular liquid water, in order to cool the two power electronics modules of the inverter.

Such a cooling system comprises at least one fluid inlet and at least one fluid outlet, in order to fluidically connect multiple cooling circuit portions. In practice, the fluid inlet or outlet takes the form of a nozzle or a spigot.

Said cooling system must generally meet numerous demands in terms of size, accessibility and cooling efficiency.

It consequently appears to be desirable to make shared use of one and the same cooling circuit portion to cool a plurality of electrical components, to optimize the use of the available heat exchange surfaces, and to reduce the length of the cooling circuit as far as possible, in order to make it possible for the cooling fluid to circulate efficiently and thus to avoid pressure drops when the fluid is circulating.

By way of example in the prior art, document US 2013039009 A1 describes an inverter comprising the joining, from top to bottom, of a cooling module, a power electronics module and a capacitor module. "Cooling module" is understood to mean a cooling fluid circulation module. Although the system described in document US 2013039009 A1 has two main heat exchange surfaces, one on each face of said cooling module, only one heat exchange surface is used to cool the power electronics module, which itself contributes to cooling the capacitor module by conduction.

In addition, document US 2013039009 A1 describes a system comprising a single power electronics module and takes an interest in electrical devices that may comprise two power electronics modules.

In order to overcome these drawbacks, one inverter configuration according to the prior art consists in joining, from top to bottom, a capacitor module, a cooling module and two juxtaposed power electronics modules. This configuration makes it possible to use the two available main heat exchange surfaces of the cooling module, but still requires the installation of a complex retaining system for the capacitor module, in order to put the capacitor module next to said cooling module so as to provide it with cooling.

In addition, and according to the prior art, it is advantageous from a cooling efficiency perspective for a power electrical device to comprise a cooling system having a single cooling circuit and more than two main heat exchange surfaces, in order to provide a plurality of electrical modules with cooling.

Document US 2018219488 A1 describes such a power electrical device comprising a housing, a plurality of electrical components to be cooled, notably a power electronics module, and an integrated cooling system. The cooling system described in document US 2018219488 A1 comprises two cooling modules providing four main heat exchange surfaces, in order to efficiently cool the plurality of electrical components. Furthermore, an efficient cooling system makes it possible to reduce the size of certain electrical components and thus to make the power electrical device more compact.

However, the housing described in document US 2018219488 A1 comprises channels that are formed in the mass of the housing and are configured to fluidically connect the two cooling modules, making the production of such a housing complex and expensive. This is because the implementation of such a housing requires expensive molding technology, notably a gravity casting process that makes use of cores, and requires that a lot of the tests, notably the leak tests, are carried out at the end of the process for manufacturing the power electrical device, this being expensive in the event of the failure of said leak tests.

Furthermore, cooling systems for power electrical devices require the use of a plurality of seals. By way of example, the power electrical device described in document US 2018219488 A1 requires at least three seals in addition to the seals positioned at the fluid inlet and outlet, including one seal having a perimeter of the same order of magnitude as the perimeter of the electrical module to be cooled. It is desirable to reduce the sealing zones as much as possible in order to reduce the probability of leakage of the cooling fluid and to make it possible to use standard seals.

To at least partially overcome these drawbacks, it is desirable for the power electrical device comprising two power electronics modules to have an architecture that makes it possible to provide said two power electronics modules with cooling, and to ensure simplified joining involving the provision of a limited total number of sealing zones in order to reduce the industrial production and manufacturing costs for power electrical devices and to reduce the risks linked to leakage of a cooling liquid.

Published patent application US2019/0275895 discloses an electrical device in which the power electronics modules are mounted on opposite sides of a capacitor module. A cooling channel is integrated in the capacitor module to connect the cooling channels located on either side of the capacitor module.

The invention thus proposes a power electrical device comprising two power electronics modules and an integrated cooling system.

SUMMARY OF THE INVENTION

More specifically, the invention relates to a power electrical device comprising a first electrical module, a second electrical module, a third electrical module, and a cooling system comprising at least one fluid inlet and at least one fluid outlet for conveying and discharging a cooling fluid to and from the cooling system, respectively, a first cooling module, comprising at least one cooling fluid circulation channel configured to cool said first electrical module, a second cooling module, comprising at least one cooling fluid circulation channel configured to cool said second electrical module, and a cooling circuit connection portion that connects said first cooling module and said second cooling module and is configured to fluidically connect said first cooling module to said second cooling module, said first and second cooling modules being positioned on either side of said third electrical module, said first and second cooling modules each having a portion that extends beyond and overhangs one and the same lateral face of said third electrical module, said portions facing one another and defining, with said lateral face, a free volume, and said first cooling module and said second cooling module each having a cooling circuit opening that leads into said free volume, said free volume accommodating said cooling circuit connection portion, said cooling circuit connection portion connecting said openings that lead into the free volume.

A power electrical device according to the invention has the resulting advantage of comprising a cooling system which is modular, efficient and involves the provision of a limited total number of sealing zones in order to reduce the risks of leakage of fluid into the power electrical device. In addition, a power electrical device according to the invention has an arrangement in the form of a stack of various modules that is configured to facilitate the process of manufacturing, joining and testing a power electrical device according to the invention. In terms of industrial production and manufacture, the invention facilitates the standardization of the devices and makes it possible to implement parallel production lines. As a result, the present invention has a considerable advantage from the point of view of the industrial manufacture of power electrical devices.

Advantageously, said first and second cooling modules are interposed between the first electrical module and the third electrical module and between the third electrical module and the second electrical module, respectively.

Advantageously, said first and second cooling modules are directly mechanically connected to the third electrical module so as to provide said third electrical module with cooling.

According to one embodiment, the power electrical device has at least one chock, which is positioned between the first cooling module and the second cooling module and borders the third electrical module, in order to perform a spacing support function between the two cooling modules and to provide a passage for the transmission of mechanical forces.

According to one embodiment, said at least one chock comprises two opposite faces each having a flat surface, said flat surfaces being configured to serve as support for a respective cooling module.

According to one embodiment, the first cooling module, the second cooling module and the chock form a housing for the power electrical device.

According to a first embodiment of the cooling system, said fluid inlet and said fluid outlet of the cooling system are each formed in one of the two cooling modules, in order to convey the cooling fluid to one of the two cooling modules and to discharge the cooling fluid from the other cooling module, respectively.

According to a second embodiment of the cooling system, said chock comprises two cooling circuit portions, a first cooling circuit portion leading out on one side into a face of said chock forming said fluid inlet of the cooling system and on the other side facing an orifice of one of said two cooling modules, a second cooling circuit portion leading out on one side into a face of said chock forming said fluid outlet of the cooling system and on the other side facing an orifice of the other one of said two cooling modules, in order to convey the cooling fluid to one of the two cooling modules and to discharge the cooling fluid from the other cooling module, respectively.

According to one embodiment, the first electrical module comprises a power electronics module, and/or the second electrical module comprises a power electronics module, and/or the third electrical module comprises a capacitor module, which is configured to perform the function of filtering and stabilizing the electricity passing through said third electrical module.

According to one embodiment, said cooling circuit connection portion comprises a first connection portion integrated in the first cooling module and a second connection portion integrated in the second cooling module, which are configured to be attached to one another in order to fluidically connect said first cooling module to said second cooling module.

According to one embodiment, said cooling circuit connection portion comprises an intermediate connection portion independent of said first cooling module and said second cooling module, said intermediate connection portion comprising a channel and two distinct openings, each of the two openings being respectively connected in a leaktight manner to said first cooling module and to said second cooling module.

Advantageously, a power electrical device according to the invention forms an inverter, a DC/DC voltage converter or an electrical charger, these being configured to be built into an electric or hybrid vehicle.

The invention also relates to a power electrical device, comprising:
 a first electrical module forming a power electronics module,
 a second electrical module forming a power electronics module,
 a third electrical module forming a capacitor module which comprises a plurality of electrical components and a casing, and
 a cooling system comprising:
  at least one fluid inlet and at least one fluid outlet for conveying and discharging a cooling fluid to and from the cooling system, respectively,
  a first cooling module, comprising at least one cooling fluid circulation channel configured to cool said first electrical module, a second cooling module, comprising at least one cooling fluid circulation channel configured to cool said second electrical module, and a cooling circuit connection portion that connects said first cooling module and said second cooling module and is configured to fluidically connect said first cooling module to said second cooling module, said first and second cooling modules being positioned on either side of said third electrical module, said first and second cooling modules each having a portion that extends beyond and overhangs one and the same lateral face of said third electrical module, said portions facing one another and defining, with said lateral face, a free volume, and said first cooling module and said second cooling module each having a cooling circuit opening that leads into said free volume, said free volume accommodating said cooling circuit connection portion, said cooling circuit connection portion connecting said openings that lead into the free volume.

This power electrical device may comprise any one of the features described above. Notably, in one variant, the third electrical module forming a capacitor module is configured to perform the function of filtering and stabilizing the electricity passing through said third electrical module.

PRESENTATION OF THE FIGURES

The invention will be better understood on reading the following description, which is given by way of example and with reference to the following figures, which are given by way of non-limiting examples and in which similar objects are provided with identical references:

It should be noted that the figures explain the invention in detail in order to implement the invention, it being of course possible for said figures to serve to better define the invention if necessary.

DETAILED DESCRIPTION OF THE INVENTION

The invention relates to a power electrical device and will be described below within the context of an inverter, which comprises two power electronics modules and at least one electrical module and is configured to be built into an electric or hybrid motor vehicle. However, that does not limit this particular application, it being possible for the invention to be any power electrical device, in particular an inverter, a DC/DC voltage converter or an electrical charger, comprising at least three electrical modules and an integrated cooling system.

Figure 1:
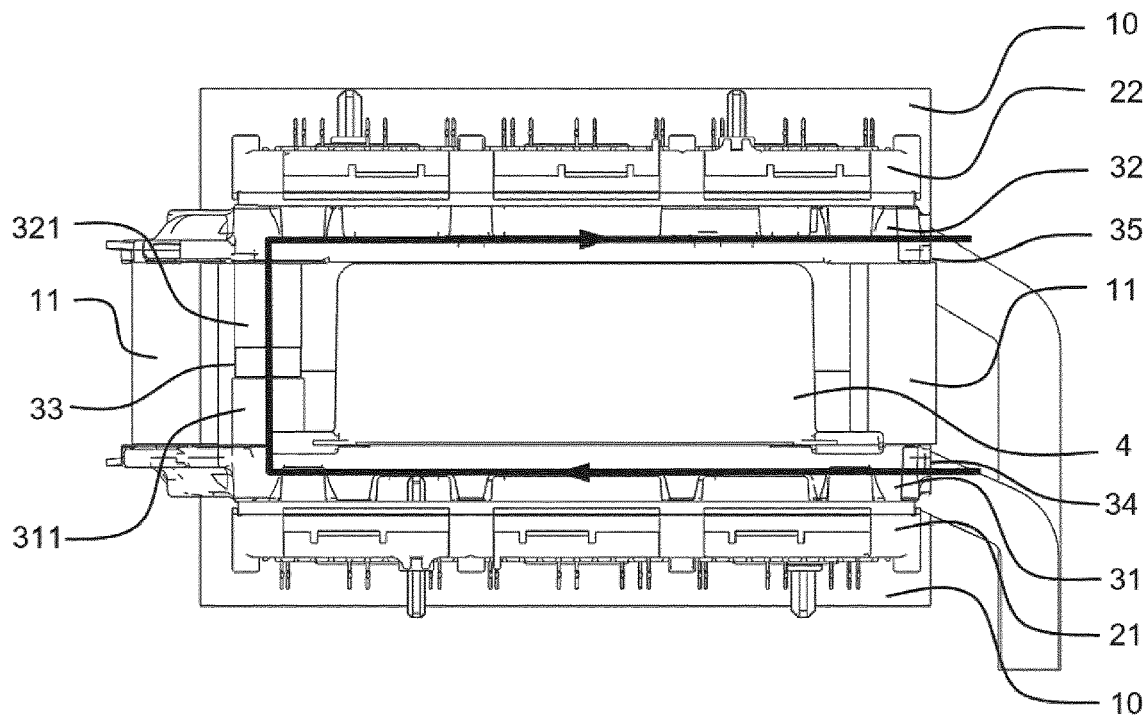
FIG. 1 shows a side view of an example of a power electrical device comprising two power electronics modules and an integrated cooling system according to the invention.

With reference to FIG. 1, the invention relates to an inverter comprising a first power electronics module 21, a second power electronics module 22, a third electrical module 4, and a cooling system 3 comprising at least one fluid inlet 34 and one fluid outlet 35 for conveying and discharging a cooling fluid to and from the cooling system 3, respectively, a first cooling module 31, a second cooling module 32, and a cooling circuit connection portion 311-321-33 that connects the first cooling module 31 and the second cooling module 32 and is configured to fluidically connect the first cooling module 31 to the second cooling module 32.

The first and second cooling modules 31, 32 are positioned on either side of the third electrical module 4 in order to provide the third electrical module 4 with cooling.

In addition, the first and second cooling modules 31-32 each have a portion that extends beyond and overhangs one and the same lateral face of said third electrical module 4, said portions facing one another and defining, with said lateral face, a free volume. The first cooling module 31 and the second cooling module 32 each have a cooling circuit opening that leads into said free volume. Said free volume accommodates said cooling circuit connection portion 311-321-33, which itself connects said openings that lead into the free volume.

The first cooling module 31 and the second cooling module 32 each comprise at least one cooling fluid circulation channel, configured to cool the first power electronics module 21 and the second power electronics module 22, respectively.

The arrangement of the various elements of an inverter according to the invention will be described in detail below.

With preference, the first cooling module 31 and the second cooling module 32 are interposed between the first power electronics module 21 and the third electrical module 4 and between the third electrical module 4 and the second power electronics module 22, respectively, in order to make use of the four available main heat exchange surfaces of the cooling system 3.

In other words, with reference to FIG. 1, the arrangement of the elements of the invention preferably corresponds to the following stack of, in succession: a first power electronics module 21, a first cooling module 31, the third electrical module 4, a second cooling module 32 and a second power electronics module 22.

According to one embodiment, the respective joining of the first power electronics module 21 and the first cooling module 31, and of the second power electronics module 22 and the second cooling module 32, via a plurality of screws, makes it possible to form two assemblies, denoted prejoined assemblies.

According to one embodiment, said prejoined assemblies comprise fixing means for joining said prejoined assemblies to the side of the housing 10 and thus contribute to the mechanical strength of said inverter.

Furthermore, the first power electronics module 21, the second power electronics module 22 and the third electrical module 4 comprise electrical connectors in order to electrically connect the third electrical module 4 to the first power electronics module 21 and to the second power electronics module 22, respectively.

The structure of the housing 10 will be described in detail below.

According to one embodiment, the power electrical device according to the invention comprises at least one chock 11, with two chocks being preferred, the two chocks being positioned between the first cooling module 31 and the second cooling module 32 and bordering the third electrical module 4, in order to serve as spacing support between the two cooling modules 31-32 and to provide a passage for the transmission of mechanical forces.

Preferably, each of the two chocks 11 comprises two opposite faces each having a flat surface, said flat surfaces being configured to serve as support for the cooling modules.

According to one embodiment, the first cooling module 31, the second cooling module 32 and said at least one chock 11 form a housing 10 for the power electrical device according to the invention.

According to one embodiment of the invention, the material from which the housing is made consists of an electrically and/or electromagnetically insulating material so as to perform an electrical and/or electromagnetic loop function, respectively.

The power electronics modules 21-22 and the third electrical module 4 will be described in more detail below.

For example, each of the two power electronics modules 21-22 transfers electricity from the battery to the electric motor (in a driving mode of the vehicle), or from the electric motor to the designated battery (for example in a regenerative braking mode of the vehicle).

According to one embodiment of the invention, the third electrical module 4 comprises fixing means in order to join it to the inverter, such that at least one of the two cooling modules 31-32 is directly mechanically connected to the third electrical module 4, in order to provide said third electrical module 4 with cooling by conduction on at least one of its faces.

Within the context of the inverter, the third electrical module 4 preferably refers to a capacitor module 4, configured to perform the function of filtering and stabilizing the voltage supplied by the battery of the vehicle.

The capacitor module 4 preferably comprises a plurality of electrical components and a casing, generally made of aluminum, which is configured to cover said plurality of electrical components. The electrical potentials, positive and negative, of a capacitor module that are to be cooled are generally located on the periphery at two opposite faces of the capacitor module. Consequently, it is suitable to use a cooling system on two faces of the capacitor module, as made possible by the invention.

The cooling system 3 according to the invention will now be described in detail.

As explained above, the cooling system 3 comprises two cooling modules 31-32 and a cooling circuit connection portion 311-321-33 that fluidically connects the two cooling modules 31-32 in a leaktight manner.

With reference to FIG. 1, the direction of circulation of the cooling fluid shown is not limiting; it is merely an illustration for visualizing one possible topology of the cooling circuit. The operating temperatures of the various electrical components, and in general the priority given to the cooling of any given electrical component, partially determine the direction of circulation of the cooling fluid.

Figure 2:
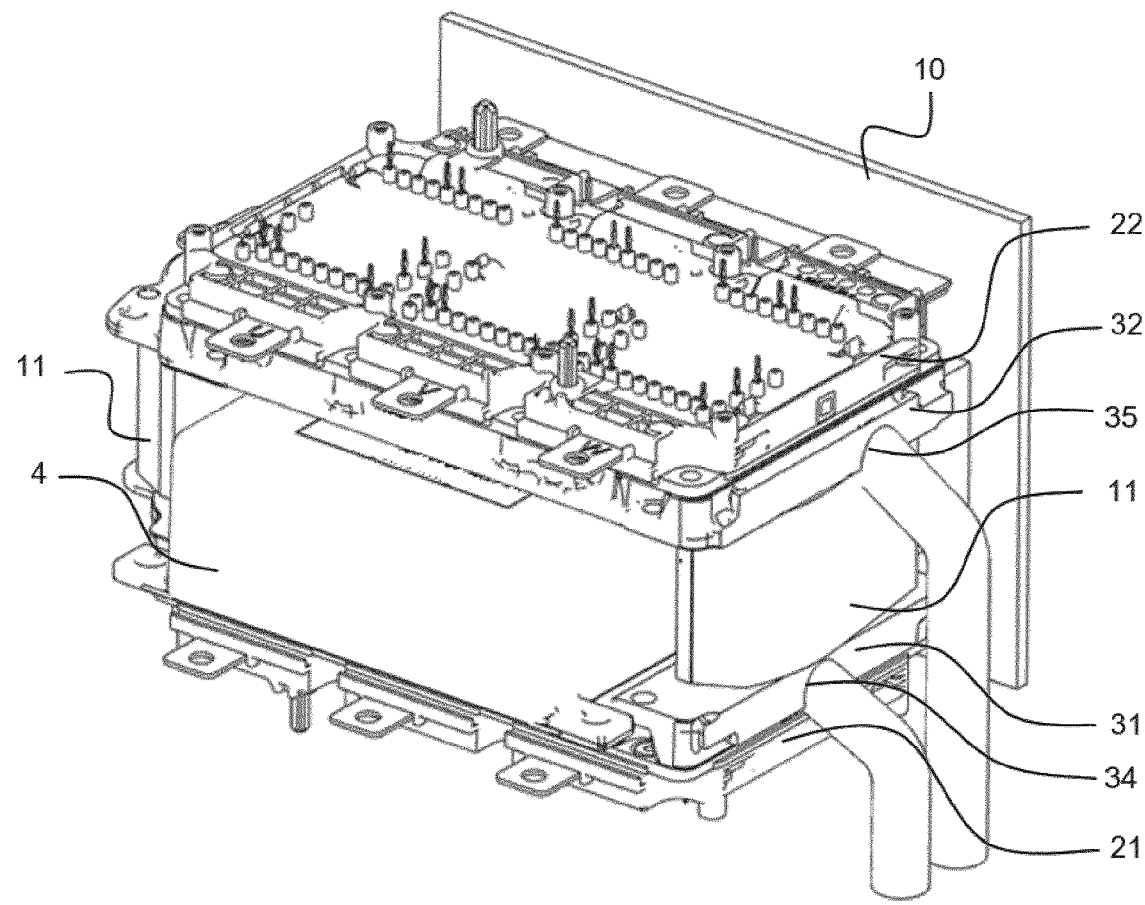
FIG. 2 shows a view of an example of a power electrical device comprising two power electronics modules and an integrated cooling system according to the invention.

According to a first embodiment, with reference to FIGS. 1 and 2, said fluid inlet 34 and said fluid outlet 35 of the cooling system 3 are each formed in one of the two cooling modules 31-32, in order to convey the cooling fluid to one of the two cooling modules 31-32 and to discharge the cooling fluid from the other cooling module 31-32, respectively. By way of example, the first cooling module 31 may contain the fluid inlet 34 and the second cooling module 32 may contain the fluid outlet 35, or vice versa.

Figure 3:
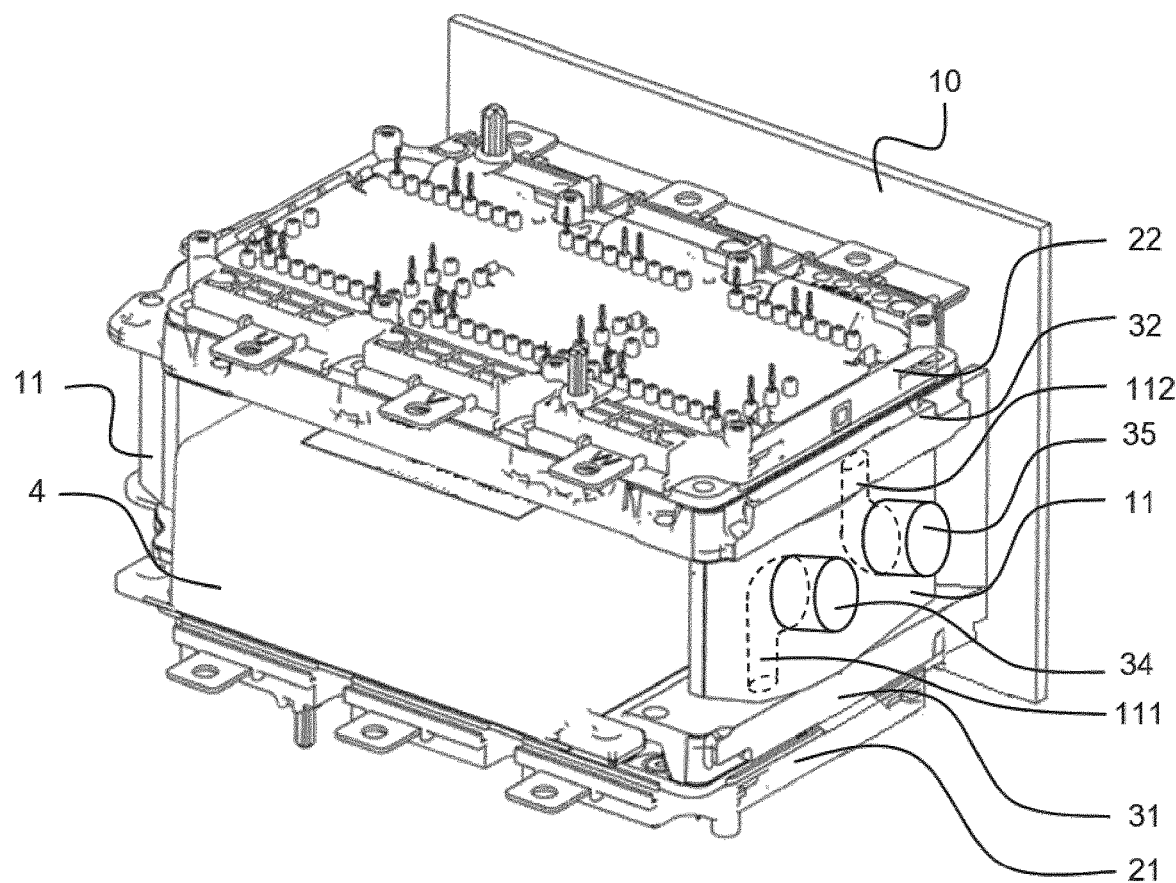
FIG. 3 shows a view of an example of a power electrical device comprising two power electronics modules and an integrated cooling system according to the invention.

According to a second embodiment, with reference to FIG. 3, said chock 11 comprises two cooling circuit portions, a first cooling circuit portion 111 leading out on one side into a face of said chock 11 forming said fluid inlet 34 of the cooling system 3 and on the other side facing an orifice of one of said two cooling modules 31-32, a second cooling circuit portion 112 leading out on one side into a face of said chock 11 forming said fluid outlet 35 of the cooling system 3 and on the other side facing an orifice of the other one of said two cooling modules 31-32, in order to convey the cooling fluid to one of the two cooling modules 31-32 and to discharge the cooling fluid from the other cooling module 31-32, respectively.

Each of the two cooling modules 31-32 consists of a leaktight system of parallelepipedal overall shape, comprising a cooling circuit portion configured to enable the optimum circulation of said cooling fluid depending on the physical distribution of the electrical components to be cooled, and at least one fluid inlet and at least one fluid outlet for conveying and discharging the cooling fluid to and from the cooling module in question, respectively.

In addition, according to the embodiment, said at least one fluid inlet and said at least one fluid outlet of each of the two cooling modules 31-32 and said at least one fluid inlet 34 and said at least one fluid outlet 35 of the cooling system 3 may take the form of a nozzle, a spigot or an orifice, it being possible for the shape of the inlet to differ from that of the outlet, provided that said at least one fluid inlet and said at least one fluid outlet of each of the two cooling modules 31-32 comprise sealing means and are designed to attach the cooling circuit portion of said cooling system 3 to distinct cooling circuit portions external to the inverter.

According to one embodiment, the cooling circuit connection portion 311-321-33 comprises a first connection portion 311 integrated in the first cooling module 31 and a second connection portion 321 integrated in the second cooling module 32, which are configured to be attached to one another in order to fluidically connect said first cooling module 31 to said second cooling module 32.

According to a first preferred embodiment, a seal, preferably a "plug and seal" type seal, connects the first connection portion 311 and the second connection portion 321 in a leaktight manner. This first embodiment makes it possible to limit the number of sealing zones to be provided on the cooling circuit connection portion to a single sealing zone.

According to a second embodiment, said cooling circuit connection portion 311-321-33 comprises an intermediate connection portion 33 independent of said first cooling module 31 and said second cooling module 32. The intermediate connection portion 33 comprises a channel and two distinct openings, each of the two openings having a sealing means, in order to connect the first connection portion 311 to the second connection portion 321 in a leaktight manner. In particular, a channel having a length of the order of magnitude of the distance between the two cooling modules 31-32 makes it possible to avoid the manufacture of cooling modules comprising a complex opening, in particular a spigot or a nozzle.

It goes without saying that the cooling circuit intermediate portion 33 is not limited to these two embodiments, which are described solely by way of example. The choice of embodiment will then result mainly from a compromise between the extent of the sealing zones to be provided and the degree of manufacturing complexity of the cooling modules.

In summary, an inverter according to the invention has a cooling system which is modular, efficient and involves the provision of a limited total number of sealing zones in order to reduce the risks of leakage of fluid into the inverter.

Notably, the cooling system for an inverter according to the invention comprises a single cooling circuit and four main heat exchange surfaces, making it possible to efficiently cool the two power electronics modules 21-22 and the capacitor module 4, which itself is preferably cooled on two faces, by contrast to the prior art in which only one face of the capacitor module is cooled.

In particular the sealing zones to be provided are limited to the fluid inlet 34, the fluid outlet 35, the join 33 between the first connection portion 311 and the second connection portion 321 of the cooling system 3, and, if appropriate, the join between the first cooling circuit portion 111 formed in the chock 11 and the inlet of one of the two cooling modules 31-32 and the join between the second cooling circuit portion 112 formed in the chock 11 and the outlet of the other cooling module 31-32 in the embodiment in which the fluid inlet 34 and the fluid outlet 35 are not directly connected to the cooling modules 31-32, consequently making it possible to reduce the risks of leakage of cooling fluid.

In addition, an inverter according to the invention has an arrangement in the form of a stack of various modules that is configured to facilitate the process of manufacturing, joining and testing an inverter according to the invention.

In terms of industrial manufacturing and production, the invention facilitates the standardization of the devices and makes it possible to implement parallel production lines, by way of example a first line for joining a power electronics module and a cooling module, a second line for joining a capacitor module, and a third line for the final joining of the inverter.

In addition, the invention makes it possible to perform leak tests on said prejoined assemblies that are each formed of a power electronics module and a cooling module, independently of the capacitor module 4 and the housing 10.

Thus, if a malfunction of the sealing system was detected, only the prejoined assembly would be scrapped. In the prior art, the very design of the power electrical device as described in the preamble does not make it possible to perform such a test separately. As a result, the power electrical device in the prior art is tested, in terms of sealing, in its entirety and, if a sealing problem is detected, the entire power electrical device must be scrapped.

As a result, the present invention has a considerable advantage from the point of view of the industrial manufacture of power electrical devices, in particular inverters.

Notably, the electrical components of the capacitor module 4 are capacitor cells.

The invention claimed is:
1. A power electrical device, comprising:
  a first electrical module forming a power electronics module,
  a second electrical module forming a power electronics module,
  a third electrical module forming a capacitor module which comprises a plurality of electrical components and a casing, and
  a cooling system comprising:
    at least one fluid inlet and at least one fluid outlet for conveying and discharging a cooling fluid to and from the cooling system, respectively,
    a first cooling module, comprising at least one cooling fluid circulation channel configured to cool said first electrical module,
    a second cooling module, comprising at least one cooling fluid circulation channel configured to cool said second electrical module, and
    a cooling circuit connection portion that connects said first cooling module and said second cooling module and is configured to fluidically connect said first cooling module to said second cooling module,
  said first and second cooling modules being positioned on either side of said third electrical module,
  said first and second cooling modules each having a portion that extends beyond and overhangs one and the same lateral face of said third electrical module, said portions facing one another and defining, with said lateral face, a free volume, and said first cooling module and said second cooling module each having a cooling circuit opening that leads into said free volume, said free volume accommodating said cooling circuit connection portion, said cooling circuit connection portion connecting said openings that lead into the free volume, and
  wherein said first cooling module and second cooling module are interposed between the first electrical module and the third electrical module and between the third electrical module and the second electrical module, respectively.

2. The electrical device as claimed in claim 1, wherein said first and second cooling modules are directly mechanically connected to the third electrical module so as to provide said third electrical module with cooling.

3. The power electrical device as claimed in claim 1, further comprising at least one chock, which is positioned between the first cooling module and the second cooling module and borders the third electrical module, in order to perform a spacing support function between the two cooling modules and to provide a passage for the transmission of mechanical forces.

4. The power electrical device as claimed in claim 3, wherein said at least one chock comprises two opposite faces each having a flat surface, said flat surfaces being configured to serve as support for a respective cooling module.

5. The power electrical device as claimed in claim 4, wherein the first cooling module, the second cooling module and the chock form a housing for the power electrical device.

6. The power electrical device as claimed in claim 3, wherein the first cooling module, the second cooling module and the chock form a housing for the power electrical device.

7. The power electrical device as claimed in claim 6, wherein said at least one chock comprises two cooling circuit portions, a first cooling circuit portion leading out on one side into a face of said at least one chock forming said fluid inlet of the cooling system and on the other side facing an orifice of one of said two cooling modules, a second cooling circuit portion leading out on one side into a face of said at least one chock forming said fluid outlet of the cooling system and on the other side facing an orifice of the other one of said two cooling modules, in order to convey the cooling fluid to one of the two cooling modules and to discharge the cooling fluid from the other cooling module, respectively.

8. The power electrical device as claimed in claim 3, wherein said at least one chock comprises two cooling circuit portions, a first cooling circuit portion leading out on one side into a face of said at least one chock forming said fluid inlet of the cooling system and on the other side facing an orifice of one of said two cooling modules, a second cooling circuit portion leading out on one side into a face of said at least one chock forming said fluid outlet of the cooling system and on the other side facing an orifice of the other one of said two cooling modules, in order to convey the cooling fluid to one of the two cooling modules and to discharge the cooling fluid from the other cooling module, respectively.

9. The power electrical device as claimed in claim 1, wherein said fluid inlet and said fluid outlet of the cooling system are each formed in one of the two cooling modules, in order to convey the cooling fluid to one of the two cooling modules and to discharge the cooling fluid from the other cooling module, respectively.

10. The power electrical device as claimed in claim 1, wherein said cooling circuit connection portion comprises a first connection portion integrated in the first cooling module and a second connection portion integrated in the second cooling module, which are configured to be attached to one another in order to fluidically connect said first cooling module to said second cooling module.

11. The power electrical device as claimed in claim 1, wherein said cooling circuit connection portion comprises an intermediate connection portion independent of said first cooling module and said second cooling module, said intermediate connection portion comprising a channel and two distinct openings, each of the two openings being respectively connected in a leaktight manner to said first cooling module and to said second cooling module.

12. The power electrical device as claimed in claim 1, forming an inverter, a DC/DC voltage converter or an electrical charger, these being configured to be built into an electric or hybrid vehicle.

13. The electrical device as claimed in claim 1, wherein said first and second cooling modules are directly mechanically connected to the third electrical module so as to provide said third electrical module with cooling.

14. The power electrical device as claimed in claim 1, further comprising at least one chock, which is positioned between the first cooling module and the second cooling module and borders the third electrical module, in order to perform a spacing support function between the two cooling modules and to provide a passage for the transmission of mechanical forces.

15. The power electrical device as claimed in claim 1, wherein said fluid inlet and said fluid outlet of the cooling system are each formed in one of the two cooling modules, in order to convey the cooling fluid to one of the two cooling modules and to discharge the cooling fluid from the other cooling module, respectively.

* * * * *